United States Patent [19]
Green et al.

[11] Patent Number: 5,942,050
[45] Date of Patent: Aug. 24, 1999

[54] METHOD OF MANUFACTURING A MULTILAYER SOLAR CELL

[75] Inventors: Martin Andrew Green, Waverley; Stuart Ross Wenham, Menai Heights; Zhengrong Shi, Wollstonecraft, all of Australia

[73] Assignee: Pacific Solar Pty Ltd., New South Wales, Australia

[21] Appl. No.: 08/849,584

[22] PCT Filed: Dec. 1, 1995

[86] PCT No.: PCT/AU95/00812

§ 371 Date: May 29, 1997

§ 102(e) Date: May 29, 1997

[87] PCT Pub. No.: WO96/17388

PCT Pub. Date: Jun. 6, 1996

[30] Foreign Application Priority Data

Dec. 2, 1994 [AU] Australia ................... PM9822

[51] Int. Cl.⁶ ............... H01L 31/0392; H01L 31/18
[52] U.S. Cl. .......................... 136/258; 438/795
[58] Field of Search ................. 136/244, 252, 136/255, 258; 438/795

[56] References Cited

U.S. PATENT DOCUMENTS

| | | | |
|---|---|---|---|
| 4,152,535 | 5/1979 | Deminet et al. | 136/89 TF |
| 4,278,830 | 7/1981 | Stirn et al. | 136/255 |
| 4,539,431 | 9/1985 | Moddel et al. | 136/258 |
| 4,638,110 | 1/1987 | Erbert | 136/246 |
| 4,769,682 | 9/1988 | Yang et al. | 136/258 |
| 5,221,365 | 6/1993 | Noguchi et al. | 136/258 |
| 5,242,507 | 9/1993 | Iverson | 148/33 |
| 5,318,919 | 6/1994 | Noguchi et al. | 437/41 |
| 5,344,796 | 9/1994 | Shin et al. | 156/603 |

FOREIGN PATENT DOCUMENTS

| | | |
|---|---|---|
| 0334110A2 | 9/1989 | European Pat. Off. . |
| 497592 | 8/1992 | European Pat. Off. . |
| 3123628A1 | 1/1983 | Germany . |
| 1-019711 | 1/1989 | Japan . |
| 2030766 | 4/1980 | United Kingdom . |

OTHER PUBLICATIONS

Masahiro Moniwa et al.: "Controlling the Solid–Phase Nucleation of Amorphous Si by Means of a Substrate Step Structure and Local Phosphorus Doping"—Japanese Journal of Applied Physics, vol., 32, No. 1B, Part 01, Jan. 1, 1993, pp. 312–317.

Matsuyama T. et al.: "Improvement of N–Type Poly–Si Film Properties by Solid Phase Crystallization Method"—Japanese Journal of Applied Physics, vol. 32, No. 9A, Part 01, Sep. 1, 1993, pp. 3720–3728.

Wei Cai et al.: "Induced Crystallization of Amorphous Silicon Film in Contact with Aluminum"—Thin Solid Films, vol. 219, No. 1/02, Oct. 30, 1992, pp. 1–3.

Hasegawa S. et al.: "Structure of Recrystallized Silicon Films Prepared from Amorphous Silicon Deposited Using Disilane"—Applied Physics Letters, vol., 62, No. 11, Mar. 15, 1993, pp. 1218–1220.

Kakkad R. et al.: "Highly Conductive Ultrathin Crystalline Si Layers By Thermal Crystallization of Amorphous Si"—Applied Physics Letters, vol. 59, No. 25, Dec. 16, 1991, pp. 3309–3311.

Patent Abstract of Japan, E–193, p. 99, JP, A, 58–90724 (Mitsubishi Denki KK) May 30, 1983.

*Primary Examiner*—John Goodrow
*Attorney, Agent, or Firm*—Jordan and Hamburg LLP

[57] ABSTRACT

A semiconductor structure and method of forming the structure, where a supporting substrate or superstrate provides the mechanical strength to support overlying thin active regions. The thin dielectric layer deposited over the substrate or superstrate serves to isolate the deposited layers from the substrate from optical, metallurgical and/or chemical perspectives. A seeding layer is then deposited, the seeding layer being of n-type silicon with appropriate treatments to give the desired large grain size. This layer may be crystallized as it is deposited, or may be deposited in amorphous form and then crystallized with further processing. A stack of alternating polarity layers of amorphous silicon or silicon alloy incorporating n-type or p-type dopants in the alternating layers is then deposited over the seeding layer. Solid phase crystallization is then performed to give the desired grain size of 3 $\mu$m or larger which can be achieved by extended heating of the layers at low temperature.

33 Claims, 4 Drawing Sheets

METHOD OF MANUFACTURING A MULTILAYER SOLAR CELL

INTRODUCTION

The present invention relates generally to the field of solar electricity generation and in particular the invention provides an improved method of manufacturing a silicon or alloy multilayer solar cell and an improved solar cell achieved by the use of that method.

BACKGROUND OF THE INVENTION

The assignees of the present application in their earlier Australian patent application No PM4834, which is incorporated herein by reference, disclose a multilayer solar cell having significant advantages over prior art solar cells. However, fabrication of this solar cell would be challenging with conventional approaches. The present invention provides a novel manufacturing method and resulting solar cell which ameliorates some or all of the difficulties of conventional approaches while retaining the advantages of the multilayer cell structure.

SUMMARY OF THE INVENTION

A first aspect the present invention provides:

a method of manufacturing a multilayer semiconductor structure for a multijunctional solar cell including the steps of:

forming directly or indirectly onto a substrate or superstrate a plurality of layers of amorphous semiconductor material to form a multilayer structure wherein adjacent layers are characterised by differing doping levels or dopant types;

forming a nucleation surface adjacent to at least one of the amorphous layers: and processing the multilayer structure by heating to a predetermined temperature to thereby cause solid phase crystallization of the amorphous layers adjacent to the nucleation layer, the crystallization nucleating from the nucleation surface.

A second aspect of the present invention provides:

a method of manufacturing a multilayer semiconductor structure for a multijunction solar cell including the steps of:

forming directly or indirectly onto a substrate or superstrate a plurality of layers of amorphous semiconductor material to form a multilayer structure wherein adjacent layers are characterised by differing doping levels or dopant types;

forming a separate semiconductor layer adjacent to at least one of the amorphous layers as a nucleation layer of crystalline or polycrystalline semiconductor material; and processing the multilayer structure by heating to a predetermined temperature to thereby cause solid phase crystallization of the amorphous layers adjacent to the nucleation layer, the crystallization nucleating from the nucleating layer.

A third aspect of the present invention provides:

a method of manufacturing a multilayer semiconductor structure for a multijunction solar cell including the steps of:

forming directly or indirectly onto a substrate or superstrate a plurality of layers of amorphous semiconductor material to form a multilayer structure wherein adjacent layers are characterised by differing doping levels or dopant types, forming a separate semiconductor layer adjacent to at least one of the amorphous layers as a nucleation layer of amorphous semiconductor material conditioned to be readily crystallized; processing the multilayer structure to cause the nucleation layer to crystallize, and further processing the multilayer structure by heating to a predetermined temperature to thereby cause solid phase crystallization of the amorphous layers adjacent to the nucleation layer, the crystallization nucleating from the nucleation layer.

A fourth aspect of the present invention provides a semiconductor structure comprising a substrate or superstrate, a plurality of amorphous layers of semiconductor material formed on the substrate or superstrate or formed over one or more intermediate layers formed on the substrate or superstrate, and a nucleating surface formed adjacent to at least one of the amorphous layers.

In various embodiments of the invention the nucleation surface may be formed as a first surface over which the amorphous layers are formed, a last surface formed over the amorphous layers or intermediate the formation of the amorphous layers.

In preferred embodiments of the invention the semiconductor material will be silicon or an alloy of silicon and germanium. However the invention is also applicable to other semiconductor materials.

In one embodiment, the amorphous silicon nucleation layer is conditioned to be readily crystalized by way of a high doping level, typically greater than 0.1% of the solid solubility of the dopant in the crystalised material (e.g. in the range of $5 \times 10^{17} - 3 \times 10^{21}$ cm$^{-3}$ or higher for phosphorous in silicon) such that onset of nucleation will occur more rapidly than in other surrounding layers upon heating of the structure.

Preferably the solid phase crystallization step will cause crystallization of substantially all of the amorphous silicon layers to occur.

In one form of the invention, the nucleation layer comprises a polycrystalline layer formed directly onto the substrate or superstrate and over which the plurality of amorphous layers are formed. The polycrystalline layer may be formed in the crystalline state or may be formed by depositing an amorphous layer and crystallizing that layer using solid phase crystallization techniques, in which case the deposited amorphous layer will be formed with characteristics, such as high doping level, preferably in the range of $3 \times 10^{18} - 3 \times 10^{21}$ cm$^{-3}$, which enhance its ability to be crystallized at low temperature.

In another form of the invention, the nucleation layer is formed intermediate the plurality of layers of amorphous silicon, the nucleation layer being formed as an amorphous layer conditioned to crystallize before the other amorphous layers, such that crystallization in the other layers nucleates outwardly from the nucleation layer.

In another embodiment of the invention, a plurality of nucleation layers are formed as amorphous layers conditioned to crystallize before the remainder of the amorphous layers, a dielectric layer being located intermediate successive nucleation layers, thereby separating the multilayer structure into layer groups, each layer group comprising one or more semiconductor layers defining at least one rectifying junction in the finished structure.

Other techniques which may be used to form the nucleating layer include:

a) growing one amorphous silicon layer using disilane in a Chemical Vapour Deposition Process (CVD) and growing the remainder of the layers using silane. The layer grown using disilane will crystallise at a temperature more than 100° C. lower than the layers grown with silane allowing the layer grown with disilane to be crystallised first and to act as the nucleation layer for the crystallisation of the other layers which will take place at a higher temperature (around 600° C.);

b) growing a layer of amorphous Silicon-Germanium alloy ($Si_xGe_{1-x}$) which will crystallise at a temperature more than 100° C. lower than surrounding amorphous silicon layers to form the nucleation layer for subsequent crystallisation of the amorphous silicon layers which will take place at a higher temperature (around 600° C.);

c) directly growing a micro-crystalline silicon layer insitu using Plasma Enhanced CVD (PECVD) using silane ($SiH_4$) highly diluted with Hydrogen ($H_2$) or Hydrogen plus Silicon Tetrafluoride ($SiF_4$). The micro-crystalline layer will then act as the nucleating layer for the remainder of the amorphous silicon layers;

d) using laser crystallization techniques to crystallise a thin surface region of a stack of amorphous silicon layers, after completion of formation of the stack. The crystalline top layer will then act as the nucleation layer for the underlying amorphous layers;

e) as for d) but using rapid thermal annealing, instead of laser crystallisation, to crystallise a thin surface region of a stack of amorphous silicon layers, after completion of formation of the stack;

f) as for d) but using metal induced crystallisation techniques, instead of laser crystallisation, to crystallise a layer on the top surface of a stack of amorphous silicon layers;

g) using a Rapid Thermal CVD (RTCVD) for a brief period (in the order of seconds) during formation of a stack of amorphous layers such that a thin layer of crystalline silicon is formed as a nucleation layer during the RTCVD process. The remaining amorphous layers are formed at a lower temperature (below 500° C.) and then crystallised at a higher temperature (about 600° C.).

It will be recognised that techniques a, b, c, f and g can be used to form surface layers or buried layers of crystalline material while techniques d and e can be used to form surface layers only.

BRIEF DESCRIPTION OF THE DRAWINGS

Embodiments of the invention will now be described by way of example with reference to the accompanying drawings in which.

DETAILED DESCRIPTION OF THE PREFERRED EMBODIMENT

Figure 1:
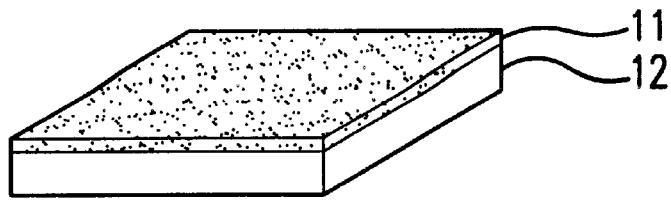
FIG. 1 illustrates a supporting substrate or superstrate onto which has been deposited a thin dielectric layer.

Referring to the drawings, FIGS. 1, 2, 3, 4 and 5 illustrate five stages in cell construction using a first method embodying the present invention.

Cells manufactured in accordance with this method will typically undergo the steps of:

(a) depositing a thin dielectric layer 11 onto a substrate or superstrate 12:

(b) depositing a thin, doped silicon seeding layer 13 onto the dielectric layer 11 with deposition conditions or subsequent processing conditions or both chosen to give large grain size in the thin layer;

(c) depositing, at low temperatures in amorphous form, successive layers 14.15.16.17 of alternating polarity silicon material with an appropriate profile of dopant impurities incorporated into each layer;

(d) crystallization of the deposited stack of layers 14, 15, 16, 17 by heating at low temperature with the crystallization nucleating from the said seeding layer;

(e) completion of cell processing to produce cell contacts 27 and interconnections (not shown).

Referring to FIG. 1 in more detail,the supporting substrate or superstrate 12 provides the mechanical strength to support the overlying thin active regions. The thin dielectric layer 11 deposited over the substrate or superstrate 12 serves to isolate the deposited layers from the substrate from optical, metallurgical and/or chemical perspectives. Typically the substrate will be glass and in some embodiments this will also form the light receiving surface, in which case a glass having good transmission properties should be chosen. Alternatively, the substrate may be another suitable material such as a ceramic or metal, in which case it may form part of the contact structure of the cell.

In this first embodiment, the seeding layer 13 is necessarily the first deposited layer of semi-conductor material.

Figure 2:
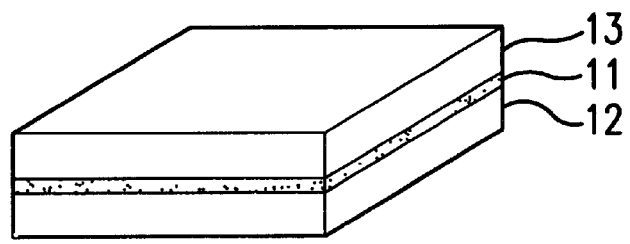
FIG. 2 illustrates the substrate or superstrate of FIG. 1 after deposition of a silicon seeding layer.

Turning to FIG. 2 this illustrates the substrate or superstrate 12 and dielectric layer 11 of FIG. 1 after deposition of a seeding layer 13 of n-type silicon and appropriate treatments to give the desired large grain size. This layer may be crystallized as it is deposited, or may be deposited in amorphous form and then crystallized with further processing. Typically, in the latter case this seeding layer would be doped with phosphorus at a level in the range of $3 \times 10^{18}$–$3 \times 10^{21}$ $cm^{-3}$, to enable crystallization to occur at low temperature and relatively quickly while growing large grain size.

Figure 3:
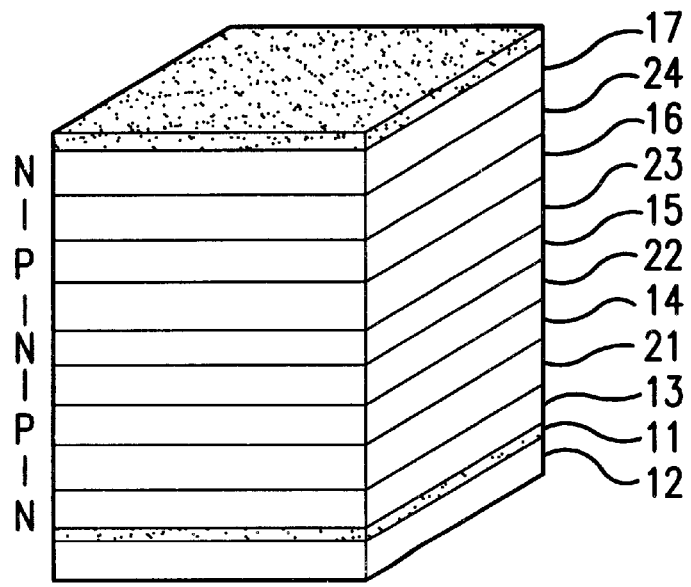
FIG. 3 illustrates the substrate or superstrate of FIG. 2 after deposition of a stack of alternating polarity amorphous silicon layers or silicon alloy layers over the seeding layer.

The structure illustrated in FIG. 3 shows the structure of FIG. 2 after deposition of a stack of alternating polarity layers 14, 15, 16, 17 of amorphous silicon or silicon alloy incorporating n-type or p-type dopants in the alternating layers. Typically, these layers will have doping levels in the range of $10^{15}$–$10^{20}$ $cm^{-3}$.

Optionally this structure may also include interposed intrinsic layers 21, 22, 23, 24 which may have a thickness ranging from close to zero to several microns.

Figure 4:
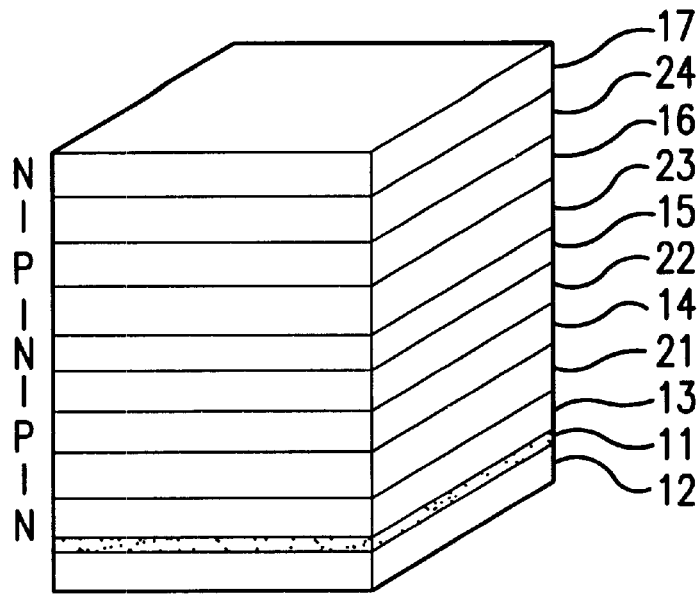
FIG. 4 illustrates the semi-conductor structure of FIG. 3 after crystallization of the multiple layer stack.

FIG. 4 shows the structure of FIG. 3 after crystallization of the multiple layer stack.

The junction regions of the multilayer cells are particularly important to the properties of the completed cells. The properties of these regions can be controlled by introducing lightly doped or intrinsic layers between successive doped layers. These layers control electric field distributions through the completed cell as well as dopant redistribution during the crystallization process.

Crystallization to give the desired grain size of 3 μm or larger can be achieved by extended heating of the layers at low temperature. For example, layers deposited as previously described were found to recrystallize to give 3 μm grain size after heating at 550° C. for 15 hours.

Alternatively, crystallization with or without melting is feasible by higher temperature, transient treatments using flash lamps or laser pulses.

Figure 5:
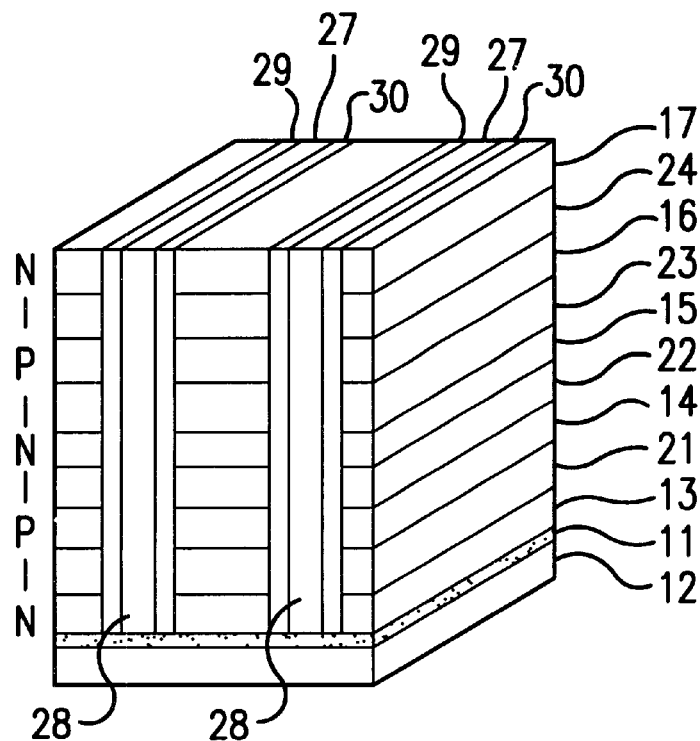
FIG. 5 illustrates a completed section of a solar cell module using the structure of FIG. 4.

A completed section of a possible solar cell module formed by this approach is illustrated in FIG. 5, in which such crystallized multiple doped layers are employed. In accordance with Australian patent application PM4834, two sets of grooves 28 have been formed in the multiple layer stack 13, 21, 14, 22, 15, 23, 16, 24, 17 with the opposing surfaces 29, 30 of each groove converted to the desired doping polarity, surface 29 having n-type doping and surface 30 having p-type doping. Metal is then formed in the grooves 28 to form contacts 27. In the regions shown, grooves of one cell overlap, or are in close proximity with, grooves of another cell, to allow interconnection between the two cells in these selected areas during the cell metallization step. This provides series interconnection of adjacent cells.

Although, in this example, groove formation is shown after crystallization of the multilayer stack, grooves could be formed before crystallization, or even earlier if techniques such as selective deposition onto the starting substrate or superstrate are employed.

In this and other embodiments made in accordance with the invention, one or more of the deposited layers can be an alloy of silicon and germanium to impart advantageous properties to the completed solar cell. These advantageous properties arise from the ability of the layers alloyed with germanium to respond to the longer wavelengths in sunlight.

Dopant densities within the layers are carefully controlled to promote controlled nucleation from the designated seeding layer rather than from the non-designated layers.

The seeding and other layers may, for example, be deposited using plasma assisted chemical vapour deposition, or other techniques such as sputtering, vacuum evaporation, or vapour deposition from silicon source gases such as disilane, silane, dichlorosilane, trichlorosilane, silicon tetrachloride, or mixtures thereof with corresponding germanium compounds with dopants incorporated by adding smaller quantities of gases containing the dopants such as diborane, phosphine or arsine. Deposition or subsequent processing conditions are chosen to eliminate possible nucleation sites from within the deposited layers so that nucleation is from the seeding layer.

Figure 6:
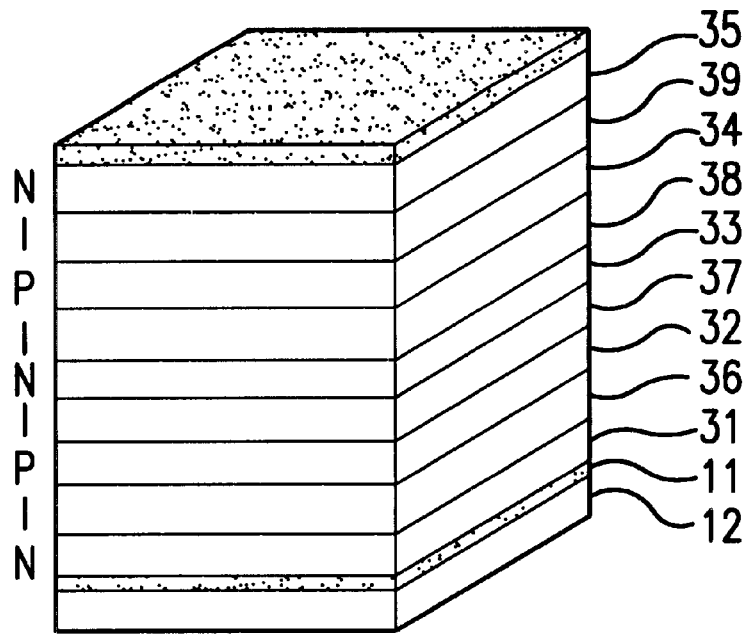
FIG. 6 illustrates a first stage in an alternative approach whereby the entire multilayer stack is first deposited in amorphous form.
Figure 7:
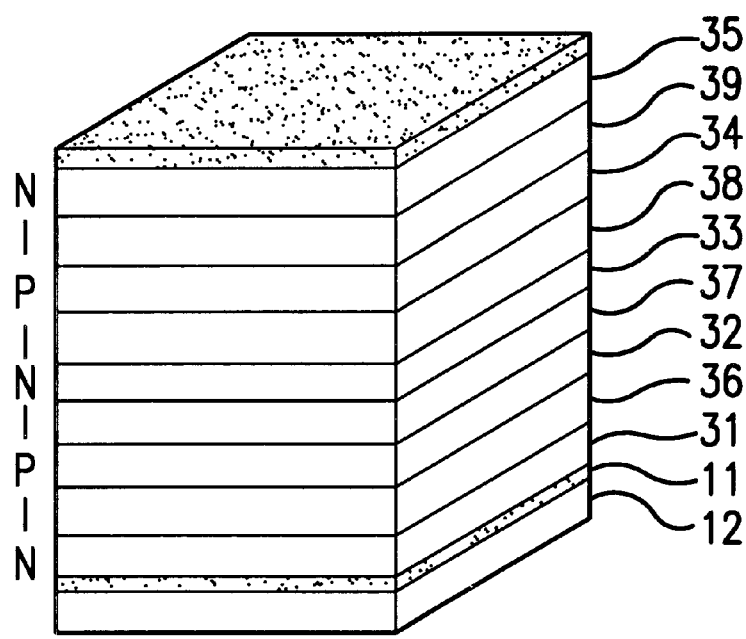
FIG. 7 illustrates the structure of FIG. 6 after crystallization has occurred in a selected layer.

Referring to FIGS. 6 and 7, two stages are illustrated in the manufacture of solar cells by a second method according to the present invention.

According to this second method the seeding layer can be deposited in amorphous form anywhere within the multilayer stack by choosing the properties of this layer so that it is the first layer to crystallize upon heating the deposited layers and so that it crystallizes to give large grain sizes. Heavily doped layers possess these dual properties, particularly layers doped with phosphorus.

In a cell made according to this alternative approach FIG. 6 illustrates the stage following the stage of FIG. 1 in the previous embodiment, whereby the entire multilayer stack of p-type, n-type and intrinsic layers 31, 32, 33, 34, 35, 36, 37, 38, 39 is first formed in amorphous form, or converted to this form after deposition. During formation, one layer (say n-type layer 33) is doped at a higher level than the remaining layers such that upon heating of the stack this layer will crystallize first, providing the seeding layer from which nucleation will then spread. Optionally more than one seeding layer can be provided within the stack, however this can lead to grain boundary problems if care is not taken. The properties of these seeding layers, including doping level, are selected to encourage crystallization in these layers prior to the other layers in the stack.

FIG. 7 shows crystallization starting in the selected layer 33. Crystallization starts at this layer and propagates to adjacent layers until the whole stack crystallizes. Groove formation and cell interconnection would then proceed as before or, also as before, groove formation could occur earlier in the sequence.

Figure 8:
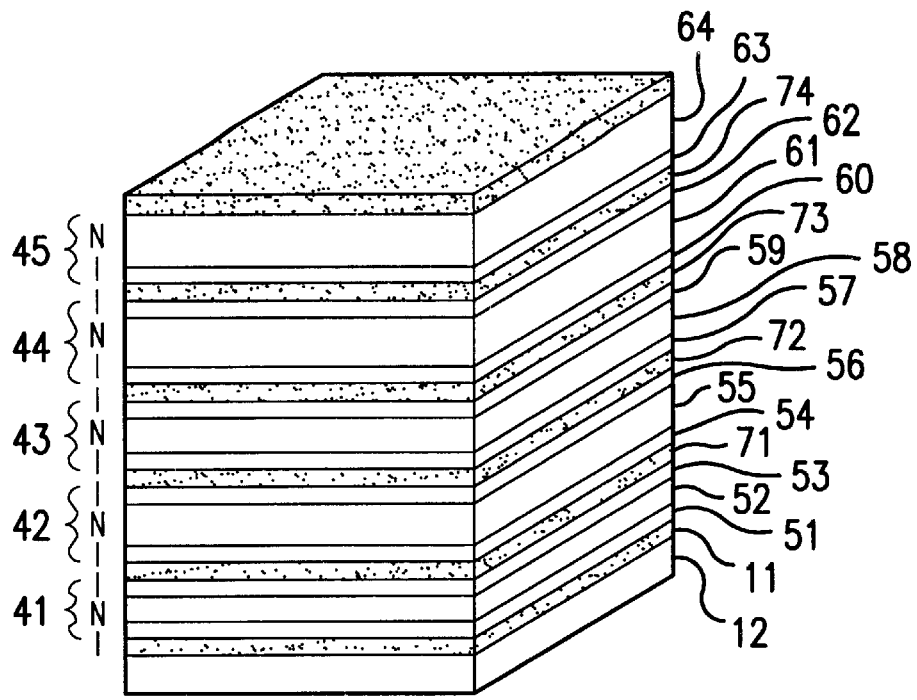
FIG. 8 illustrates a first stage in another alternative approach in which the stack is formed with dielectric layers such as silicon dioxide interposed between regions chosen for their crystallization properties.
Figure 9:
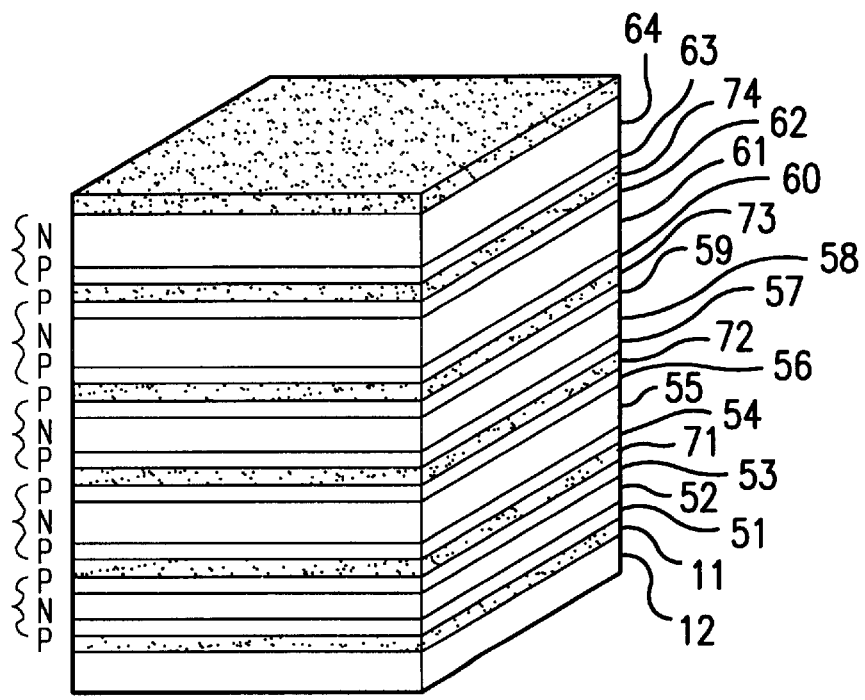
FIG. 9 illustrates the stack of FIG. 8 after the crystallization step.

Referring to FIGS. 8 & 9, two stages are illustrated in the manufacture of solar cells by a third method according to the present invention. In this third method groups 41, 42, 43, 44, 45 of amorphous layers 57, 52, 53, 54, 55, 56, 57, 58, 59, 60, 61, 62, 63, 64 are formed, each group separated from its neighbouring group by a dielectric layer, 71, 72, 73, 74. This structure enables crystallization to proceed rapidly in each group, while the inclusion of non-crystalline dielectric layers such as silicon oxide, silicon nitride or silicon oxynitrides within the amorphous stack will keep the various crystalizing regions separated. The dielectric layers will remain non-crystalline during the crystallization process due to the higher temperatures required for these to crystallize. These dielectric layers form boundaries between each of the subregions in which crystallization is occurring, preventing crystallographic defects such as grain boundaries which might otherwise occur if the growing crystals from each sub-region were allowed to impinge on those of another subregion. Additionally, by doping these dielectric layers during deposition, diffusion of the dopants from these dielectric layers during subsequent thermal and other processing treatments can be used to advantage to dope neighbouring regions, giving additional layers in the stack and/or reducing carrier recombination along the associated interface and grain boundaries. Treatment in a hydrogen ambient has been shown to accelerate diffusion at the temperatures of interest.

FIG. 8 shows the stack with dielectric layers such as silicon dioxide interposed between regions chosen for their crystallization properties. In this case, the silicon dioxide layer is doped with a p-type dopant in silicon, such as boron.

FIG. 9 shows the stack of FIG. 8 after the crystallization step and the release of the dopants from the dielectric layer. This may be encouraged, for example, by use of a hydrogen ambient. Groove formation and cell connection would then proceed as before or, also as before, groove formation could occur earlier in the sequence.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive. For example, although layers are shown in the illustrations as being planar and of approximately equal thickness this is for convenience and clarity in the description of the principles of the invention. It is well known, however, that substantial advantages will accrue from pattered or rough interfaces and by designing for different thicknesses within the layers shown.

We claim:

1. A method of manufacturing a multilayer semiconductor structure for a multijunction solar cell including the steps of:
   forming directly or indirectly onto a substrate or superstrate a plurality of layers of amorphous semiconductor material to form a multilayer structure wherein adjacent layers are characterised by differing doping levels or dopant types;
   forming a semiconductive nucleation surface adjacent to at least one of the amorphous layers; and
   processing the multilayer structure by heating to a predetermined temperature to thereby cause solid phase crystallization of the amorphous layers adjacent to the nucleation layer, the crystallization nucleating from the nucleation surface.

2. The method as claimed in claim 1, wherein the nucleation surface is formed by forming a separate semiconductor layer adjacent to at least one of the amorphous layers as a nucleation layer of crystalline or polycrystalline semiconductor material.

3. The method as claimed in claim 2, wherein the crystalline or polycrystalline nucleation layer is formed by forming a semiconductor layer of amorphous semiconductor material conditioned to be readily crystallized, and processing the multilayer structure to cause the nucleation layer to crystallize.

4. The method as claimed in claim 3, wherein the amorphous silicon nucleation layer is conditioned to be readily crystallized by way of a high doping level, the doping level being higher than that of adjacent amorphous layers.

5. The method of claim 4 wherein the high doping level is within 0.1% of the solid solubility of the semiconductor material.

6. The method of claim 5 wherein the semiconductor material is silicon and the doping level is in the range of $5 \times 10^{17}$–$3 \times 10^{21}$ cm$^{-3}$ (i.e. atoms per cubic centimetres).

7. The method as claimed in claim 6, wherein the high doping level is in the range of $3 \times 10^{18}$–$3 \times 10^{21}$ cm$^{-3}$.

8. The method as claimed in claim 1, wherein the nucleation surface is formed as a first layer over which the amorphous layers are formed.

9. The method as claimed in claim 1, wherein the nucleation surface is formed as a top layer surface formed over the amorphous layers.

10. The method as claimed in claim 1, wherein the nucleation surface is formed as an intermediate layer in the formation of amorphous layers.

11. The method as claimed in claim 3, wherein a plurality of nucleation layers are formed as amorphous layers conditioned to crystallize before the remainder of the amorphous layers, a dielectric layer being located intermediate successive nucleation layers, thereby separating the multilayer structure into layer groups, each layer group comprising one or more semiconductor layers defining at least one rectifying junction in the finished structure.

12. The method as claimed in claim 11, wherein the nucleation surfaces are formed as first layers over each dielectric layer and over which the amorphous layers of the respective layer group are formed.

13. The method as claimed in claim 11, wherein the nucleation surfaces are formed as top layers over the amorphous layers of the respective layer group and over which the respective dielectric layer is formed.

14. The method as claimed in claim 11, wherein each of the nucleation surfaces is formed as an intermediate layer of the amorphous layers of a respective layer group.

15. The method as claimed in claim 1, wherein the semiconductor material is silicon or an alloy of silicon and germanium.

16. The method as claimed in claim 1, wherein a subsequent solid phase crystallization step is provided to cause crystallization of substantially all of the amorphous silicon layers to occur.

17. A semiconductor structure comprising a substrate or superstrate, a plurality of amorphous layers of semiconductor material located on the substrate or superstrate or located over one or more intermediate layers formed on the substrate or superstrate, and a semiconductive nucleating surface located adjacent to at least one of the amorphous layers the amorphous layers being characterised by adjacent layers having different dopant levels or dopant types.

18. The structure as claimed in claim 17, wherein a surface of a separate nucleation layer of crystalline or polycrystalline semiconductor material located adjacent to at least one of the amorphous layers is provided as the nucleation surface.

19. The structure as claimed in claim 17, wherein a surface of a separate nucleation layer of amorphous semiconductor material conditioned to be readily crystallized is provided as the nucleation surface.

20. The structure as claimed in claim 19, wherein the the amorphous silicon nucleation layer is conditioned to be readily crystallized by way of a high doping level, the doping level being higher than that of adjacent amorphous layers.

21. The structure as claimed in claim 20, wherein the high doping level is within 0.1% of the solid solubility of the semiconductor material.

22. The structure as claimed in claim 21, wherein the semiconductor material is silicon and the doping level is in the range of $5 \times 10^{17}$–$3 \times 10^{21}$ cm$^{-3}$ (i.e. atoms per cubic centimetres).

23. The structure as claimed in claim 22, wherein the high doping level is in the range of $3 \times 10^{18}$–$3 \times 10^{21}$ cm$^{-3}$.

24. The structure as claimed in claim 17, wherein the nucleation surface is provided as an underlying surface over which the amorphous layers are located.

25. The structure as claimed in claim 17, wherein the nucleation surface is provided as a top surface located over the amorphous layers.

26. The structure as claimed in claim 17, wherein the nucleation surface is provided as an intermediate layer in the structure of amorphous layers.

27. The structure as claimed in claim 19, wherein a plurality of nucleation layers are provided as amorphous layers conditioned to crystallize before the remainder of the amorphous layers, a dielectric layer being located intermediate successive nucleation layers, thereby separating the multilayer structure into layer groups, each layer group comprising one or more semiconductor layers defining at least one rectifying junction in the finished structure.

28. The method as claimed in claim 27, wherein the conditioned amorphous layers are located as bottom layers immediatly adjacent to each dielectric layer and over which the remaining amorphous layers of the respective layer group are located.

29. The method as claimed in claim 27, wherein the conditioned amorphous layers are located as top layers immediatly adjacent to each dielectric layer and under which the remaining amorphous layers of the respective layer group are located.

30. The method as claimed in claim 27, wherein the conditioned amorphous layers are located as an intermediate layer of the amorphous layers of a respective layer group.

31. The structure as claimed in claim 17, wherein the semiconductor material is silicon or an alloy of silicon and germanium.

32. A semiconductor device formed by applying solid phase crystallization to the structure as claimed in claim 17.

33. A semiconductor device formed by the method as claimed in claim 1.

\* \* \* \* \*